United States Patent
Yamamoto et al.

(10) Patent No.: US 6,670,846 B2
(45) Date of Patent: Dec. 30, 2003

(54) SEMICONDUCTOR INTEGRATED CIRCUIT INCLUDING A FILTER WITH ADJUSTABLE CUT-OFF FREQUENCY

(75) Inventors: Seiji Yamamoto, Tokyo (JP); Kenji Kanoh, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/216,728

(22) Filed: Aug. 13, 2002

(65) Prior Publication Data

US 2003/0169101 A1 Sep. 11, 2003

(30) Foreign Application Priority Data

Mar. 6, 2002 (JP) ........................................ 2002-060818

(51) Int. Cl.[7] ................................................ H03K 5/00
(52) U.S. Cl. ...................... 327/554; 327/553; 327/555
(58) Field of Search .............................. 327/551, 552, 327/553, 554, 555, 556, 557, 558, 559

(56) References Cited

U.S. PATENT DOCUMENTS

| | | | |
|---|---|---|---|
| 4,791,379 A | 12/1988 | Hughes | |
| 4,835,490 A | 5/1989 | Mazzucco et al. | |
| 5,416,438 A * | 5/1995 | Shibata | 327/552 |
| 5,466,976 A | 11/1995 | Ichihara | |
| 5,565,812 A * | 10/1996 | Soenen | 327/558 |
| 5,914,633 A * | 6/1999 | Comino et al. | 327/553 |
| 6,060,935 A * | 5/2000 | Shulman | 327/345 |
| 6,107,870 A * | 8/2000 | Kawano | 327/553 |
| 6,288,669 B1 * | 9/2001 | Gata | 341/172 |
| 6,424,209 B1 * | 7/2002 | Gorecki et al. | 327/554 |
| 6,452,443 B1 * | 9/2002 | Thompson et al. | 327/553 |
| 6,509,791 B2 * | 1/2003 | Segawa et al. | 327/554 |
| 2003/0090316 A1 * | 5/2003 | Dathe et al. | 327/554 |

FOREIGN PATENT DOCUMENTS

| | | |
|---|---|---|
| JP | 63-51664 | 3/1988 |
| JP | 63-280504 | 11/1988 |
| JP | 61-189718 | 12/1988 |
| JP | 5-180881 | 7/1993 |

* cited by examiner

*Primary Examiner*—Terry D. Cunningham
(74) *Attorney, Agent, or Firm*—Leydig, Voit & Mayer, Ltd.

(57) ABSTRACT

A semiconductor integrated circuit includes a filter and a time-constant detecting circuit. The filter includes resistance elements; capacitance elements, each of which consists of a capacitance-value switching circuit that can vary the capacitance of the capacitance elements and operational amplifiers. The time-constant detecting circuit detects the time constant of the capacitance element and resistance element, which are formed independently of the capacitance elements and resistance elements of the filter. The semiconductor integrated circuit varies the capacitance of the capacitance element in response to the detected time constant to prevent a reduction in the yield by adjusting the cut-off frequency of the filter in spite of variations in manufacturing the resistance elements and capacitance elements of the filter.

9 Claims, 6 Drawing Sheets

US 6,670,846 B2

SEMICONDUCTOR INTEGRATED CIRCUIT INCLUDING A FILTER WITH ADJUSTABLE CUT-OFF FREQUENCY

BACKGROUND OF THE INVENTION

1. Field of the Invention

The present invention relates to a semiconductor integrated circuit including a filter in which yield reduction is minimized by adjusting the cut-off frequency in accordance with manufacturing variations in resistance elements and capacitance elements constituting the filter.

2. Description of Related Art

FIG. 7 shows a conventional filter-equipped semiconductor integrated circuit disclosed in Japanese patent application laid-open No. 61–189718 (1986), for example. In FIG. 7, the reference numeral 201 designates a differential operational amplifier; and 202 designates a resistance element connected to the inverting input terminal of the differential operational amplifier 201. The reference numeral 203 designates a resistance element connected across the inverting input terminal and the output terminal of the differential operational amplifier 201; and 204 designates a capacitance element connected in parallel with the resistance element 203.

Next, the operation of the conventional circuit will be described.

The filter shown in FIG. 7 is a known first-order active filter, and has a cut-off frequency given by $$f_c = 1/2\pi (R_f C_f)^{0.5} \quad (1)$$

where $R_f$ is a resistance value of the resistance element 203, and $C_f$ is a capacitance value of the capacitance element 204.

With the foregoing configuration, the conventional filter-equipped semiconductor integrated circuit has a problem in that its cut-off frequency can deviate because of variations in manufacturing the resistance elements and capacitance element constituting the filter, and hence it cannot meet a cut-off frequency standard, resulting in a defective.

SUMMARY OF THE INVENTION

The present invention is implemented to solve the foregoing problem. It is therefore an object of the present invention to provide a filter-equipped semiconductor integrated circuit capable of minimizing the yield reduction by adjusting the cut-off frequency considering the manufacturing variations in the resistance elements and capacitance elements constituting the filter.

According to one aspect of the present invention, there is provided a filter-equipped semiconductor integrated circuit including: a filter including resistance elements, capacitance elements, each of which consists of a capacitance-value switching circuit for changing the capacitance value of the capacitance element, and operational amplifiers; and a time-constant detecting circuit for detecting a time constant of a capacitance element and a resistance element, which are provided independently of the capacitance elements and resistance elements of the filter. The capacitance values of the capacitance elements of the filter are adjusted in response to the time constant detected by the time-constant detecting circuit It offers an advantage of being able to detect and adjust the deviation of the cut-off frequency of the filter with ease.

DETAILED DESCRIPTION OF THE PREFERRED EMBODIMENTS

The invention will now be described with reference to the accompanying drawings.

Embodiment 1

Figure 1:
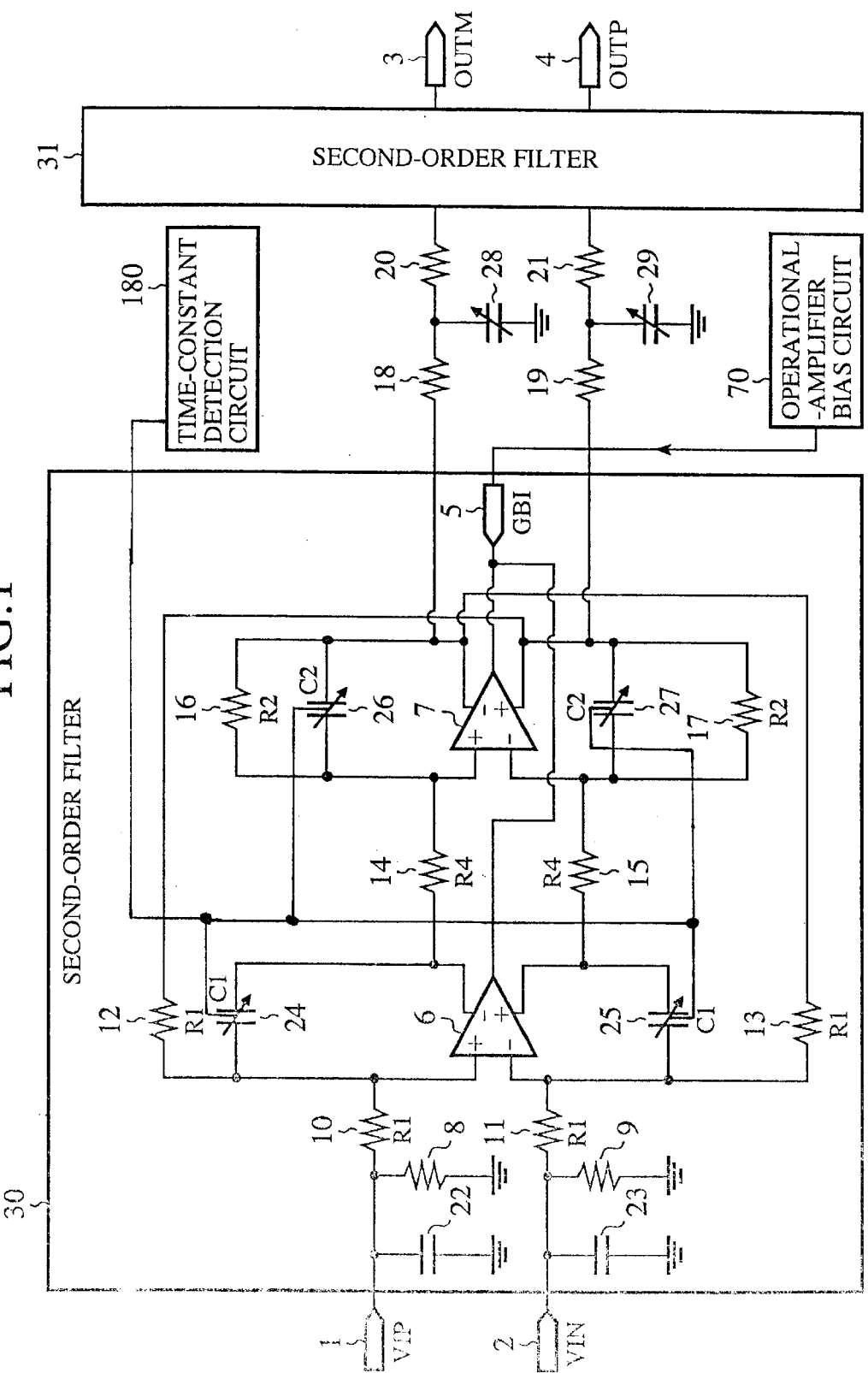
FIG. 1 is a circuit diagram showing a configuration of a fifth-order Butterworth differential filter circuit of an embodiment 1 in accordance with the present invention.

FIG. 1 is a circuit diagram showing a configuration of a fifth-order Butterworth differential filter circuit of an embodiment 1 in accordance with the present invention. In FIG. 1, reference numerals 30 and 31 each designate a second-order filter. The second-order filter 31 has the same configuration as the second-order filter 30. Reference numerals 1 (VIP) and 2 (VIN) designate input terminals to which a differential input signal is applied. Reference numerals 3 (OUTM) and 4 (OUTP) designate output terminals from which a differential output signal is output. Reference numerals 18–21 each designate a resistance element; and 28 and 29 each designates a capacitance element. The resistance elements 18 and 20 and the capacitance element 28 constitute a first-order filter; and the resistance elements 19 and 21 and the capacitance element 29 constitute another first-order filter. The reference numeral 5 designates an input terminal of a bias voltage; reference numerals 6 and 7 each designate a differential operational amplifier; 8–17 each designate a resistance element; and 22–27 each designate a capacitance element. The cut-off frequency is adjusted by switching the capacitance values of the capacitance elements 24–29. An operational-amplifier bias circuit 70 and a time-constant detection circuit 180 will be described later.

Next, the connection within the circuit of FIG. 1 will be described.

The input terminal 1 (VIP) is connected to first terminals of the capacitance element 22 and resistance elements 8 and 10. Second terminals of the capacitance element 22 and resistance element 8 are connected to a ground GND. A second terminal of the resistance element 10 is connected to a non-inverting input of the differential operational amplifier 6. The input terminal 2 (VIN) is connected to first terminals of the capacitance element 23 and resistance elements 9 and 11. Second terminals of the capacitance element 23 and resistance element 9 are connected to the ground GND. A second terminal of the resistance element 11 is connected to an inverting input of the differential operational amplifier 6.

First terminals of the resistance element 12 and capacitance element 24 are connected to the non-inverting input of the differential operational amplifier 6. A second terminal of the resistance element 12 is connected to the non-inverted output of the differential operational amplifier 7, and a second terminal of the capacitance element 24 is connected to the inverted output of the differential operational amplifier 6. First terminals of the resistance element 13 and capacitance element 25 are connected to the inverting input of the differential operational amplifier 6. A second terminal of the resistance element 13 is connected to the inverted output of the differential operational amplifier 7, and a second terminal of the capacitance element 25 is connected to the non-inverted output of the differential operational amplifier 6.

A first terminal of the resistance element 14 is connected to the inverted output of the differential operational amplifier 6, and a second terminal of the resistance element 14 is connected to the non-inverting input of the differential operational amplifier 7. A first terminal of the resistance element 15 is connected to the non-inverted output of the differential operational amplifier 6, and a second terminal of the resistance element 15 is connected to the inverting input of the differential operational amplifier 7.

First terminals of the resistance element 16 and capacitance element 26 are connected to the non-inverting input of the differential operational amplifier 7, and second terminals of the resistance element 16 and capacitance element 26 are connected to the inverted output of the differential operational amplifier 7. First terminals of the resistance element 17 and capacitance element 27 are connected to the inverting input of the differential operational amplifier 7, and second terminals of the resistance element 17 and capacitance element 27 are connected to the non-inverted output of the differential operational amplifier 7.

The bias input terminal 5 (GBI) is connected to bias voltage inputs of the differential operational amplifiers 6 and 7. A first terminal of the resistance element 18 is connected to the inverted output of the differential operational amplifier 7. A first terminal of the resistance element 19 is connected to the non-inverted output of the differential operational amplifier 7. A second terminal of the resistance element 18 is connected to a first terminal of the capacitance element 28. A second terminal of the resistance element 19 is connected to a first terminal of the capacitance element 29. A second terminal of the capacitance element 28 is connected to the ground GND, and a second terminal of the capacitance element 29 is connected to the ground GND.

A first terminal of the resistance element 20 is connected to a first terminal of the capacitance element 28, and a second terminal of the resistance element 20 is connected to a first input terminal of the second-order filter 31. A first terminal of the resistance element 21 is connected to a first terminal of the capacitance element 29, and a second terminal of the resistance element 21 is connected to a second input terminal of the second-order filter 31. A first output terminal of the second-order filter 31 is connected to the output terminal 3 (OUTM), and a second output terminal of the second-order filter 31 is connected to the output terminal 4 (OUTP).

Next, the operation of the present embodiment 1 will be described.

Here, the adjustment of the cut-off frequency of the second-order filter 30 of FIG. 1 will be described. In the second-order filter 30 of FIG. 1, the capacitance elements 22 and 23 are a stabilizing capacitance, and the resistance elements 8 and 9 are an input-signal-amplitude adjusting resistance element. The circuit operating as the second-order filter consists of circuit components other than the capacitance elements 22 and 23 and the resistance elements 8 and 9. Assume that the resistance value of the resistance elements 10–13 is R1, that of the resistance elements 16 and 17 is R2, that of the resistance elements 14 and 15 is R4, the capacitance value of the capacitance elements 24 and 25 is C1, and that of the capacitance elements 26 and 27 is C2. Then the cut-off frequency $f_c$ is given by $$f_c = 1/(2\pi(C1 \times C2 \times R1 \times R4)^{0.5}) \qquad (2)$$

Therefore, the cut-off frequency $f_c$ is adjustable by switching the capacitance values C1 and C2.

Figure 2:
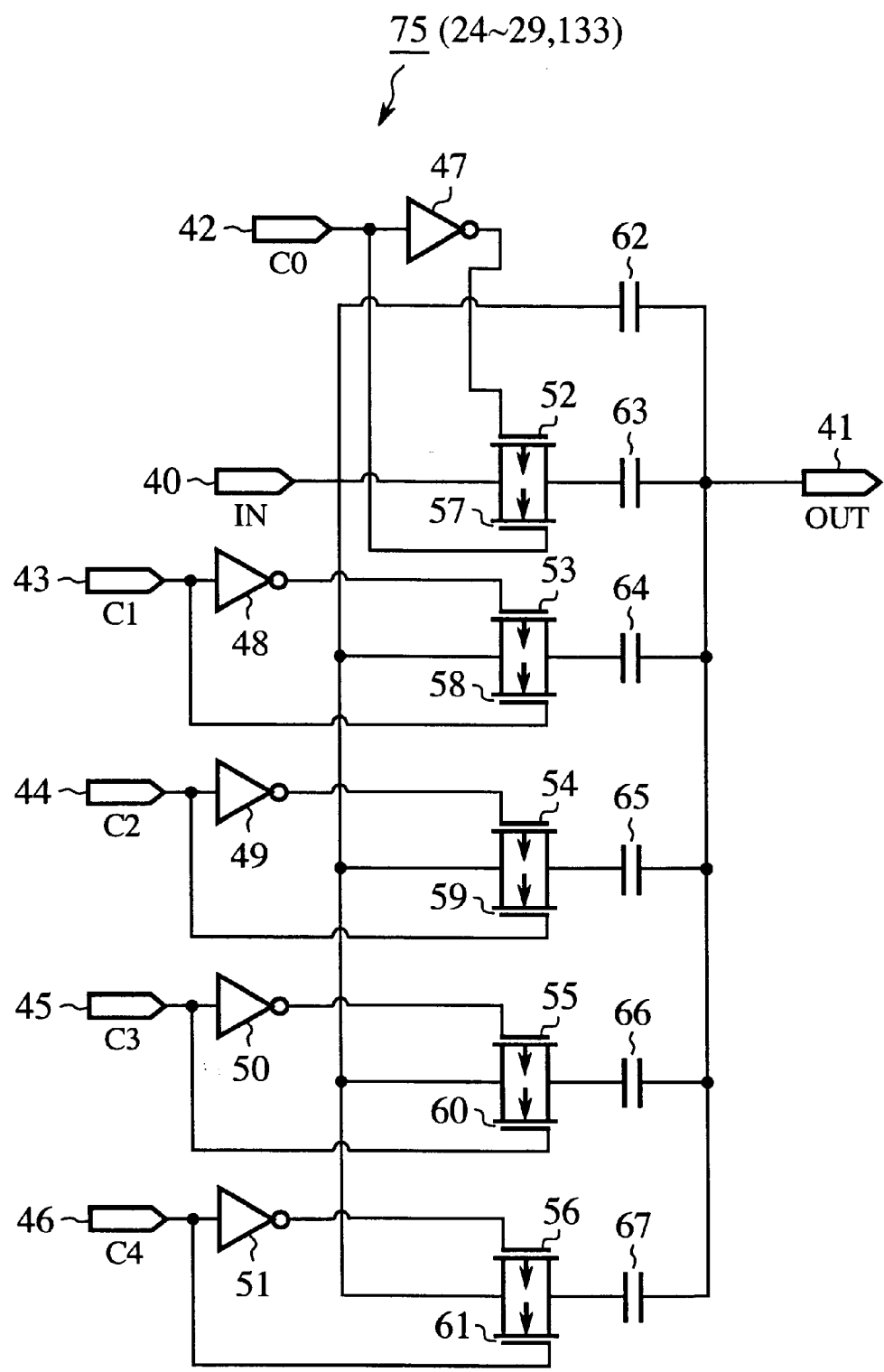
FIG. 2 is a circuit diagram showing a configuration of a capacitance-value switching circuit for changing the capacitance value in the embodiment 1 in accordance with the present invention.

FIG. 2 is a circuit diagram showing a configuration of a capacitance-value switching circuit 75 for changing the capacitance value in the embodiment 1 in accordance with the present invention. The capacitance-value switching circuit 75 of FIG. 2 constitutes each of the capacitance elements 24–29 of FIG. 1. In FIG. 2, the reference numeral 40 (IN) designates an input terminal of each of the capacitance elements 24–29 (see, FIG. 1), and 41 (OUT) designates an output terminal of each of the capacitance elements 24–29. Reference numerals 42 (C0)-46 (C4) each designate a capacitance-switching input terminal. Reference numerals 52–56 each designate a P-channel transistor, and 57–61 each designate an N-channel transistor. A couple of the P-channel transistor and N-channel transistor constitutes a switch for switching the capacitance value. Reference numerals 62–67 each designate a capacitance element, and 47–51 each designate an inverter.

Next, the connection within the capacitance-value switching circuit 75 will be described.

The input terminal 40 (IN) is connected to a first terminal of the capacitance element 62, and the output terminal 41 (OUT) is connected to a second terminal of the capacitance element 62.

A couple of the P-channel transistor 52 and N-channel transistor 57 constituting a switch has their sources connected to each other and their drains connected to each other. In addition, the sources are connected to the input terminal 40 (IN), and the drains are connected to a first terminal of the capacitance element 63. The capacitance-switching input terminal 42 (C0) is connected to the gate of the N-channel transistor 57 and to the input terminal of the inverter 47. The output terminal of the inverter 47 is connected to the gate of the P-channel transistor 52. A second terminal of the capacitance element 63 is connected to the output terminal 41 (OUT).

A couple of the P-channel transistor 53 and N-channel transistor 58 constituting a switch has their sources connected to each other and their drains connected to each other. In addition, the sources are connected to the input terminal 40 (IN), and the drains are connected to a first terminal of the capacitance element 64. The capacitance-switching input terminal 42 (C1) is connected to the gate of the N-channel transistor 58 and to the input terminal of the inverter 48. The output terminal of the inverter 48 is connected to the gate of the P-channel transistor 53. A second terminal of the capacitance element 64 is connected to the output terminal 41 (OUT).

A couple of the P-channel transistor 54 and N-channel transistor 59 constituting a switch has their sources connected to each other and their drains connected to each other. In addition, the sources are connected to the input terminal 40 (IN), and the drains are connected to a first terminal of the capacitance element 65. The capacitance-switching input terminal 44 (C2) is connected to the gate of the N-channel transistor 59 and to the input terminal of the inverter 49. The output terminal of the inverter 49 is connected to the gate of the P-channel transistor 54. A second terminal of the capacitance element 65, is connected to the output terminal 41 (OUT).

A couple of the P-channel transistor 55 and N-channel transistor 60 constituting a switch has their sources connected to each other and their drains connected to each other. In addition, the sources are connected to the input terminal 40 (IN), and the drains are connected to a first terminal of the capacitance element 66. The capacitance-switching input terminal 45 (C3) is connected to the gate of the N-channel transistor 60 and to the input terminal of the inverter 50. The output terminal of the inverter 50 is connected to the gate of the P-channel transistor 55. A second terminal of the capacitance element 66 is connected to the output terminal 41 (OUT).

A couple of the P-channel transistor 56 and N-channel transistor 61 constituting a switch has their sources connected to each other and their drains connected to each other. In addition, the sources are connected to the input terminal 40 (IN), and the drains are connected to a first terminal of the capacitance element 67. The capacitance-switching input terminal 46 (C4) is connected to the gate of the N-channel transistor 61 and to the input terminal of the inverter 51. The output terminal of the inverter 51 is connected to the gate of the P-channel transistor 56. A second terminal of the capacitance element 67 is connected to the output terminal 41 (OUT).

Next, the capacitance switching operation of the capacitance elements 24–29 (FIG. 1) will be described.

In FIG. 2, the control signal of the capacitance-switching is input to the capacitance-switching input terminals 42 (C0)-46 (C4) to bring each couple of the P-channel transistor and N-channel transistor constituting the switches connected to the capacitance-switching input terminals 42 (C0)-46 (C4) into conduction or out of conduction. Thus, the capacitance elements (63–67) connected to the switches in a conduction state are connected in parallel to the capacitance element 62, thereby changing the capacitance value of each of the capacitance elements 24–29 of FIG. 1.

As described above, the filter-equipped semiconductor integrated circuit of the present embodiment 1 comprises the filter 30 including the resistance elements 10–17, the capacitance elements 24–27, each of which consists of the capacitance-value switching circuit 75 (FIG. 2) for varying the capacitance value of the capacitance element, and the operational amplifiers 6 and 7.

As described above, the present embodiment 1 is configured such that the capacitance-value switching circuits vary the capacitance values of the capacitance elements constituting the filter. As a result, it offers an advantage of being able to adjust the cut-off frequency.

Embodiment 2

Figure 3:
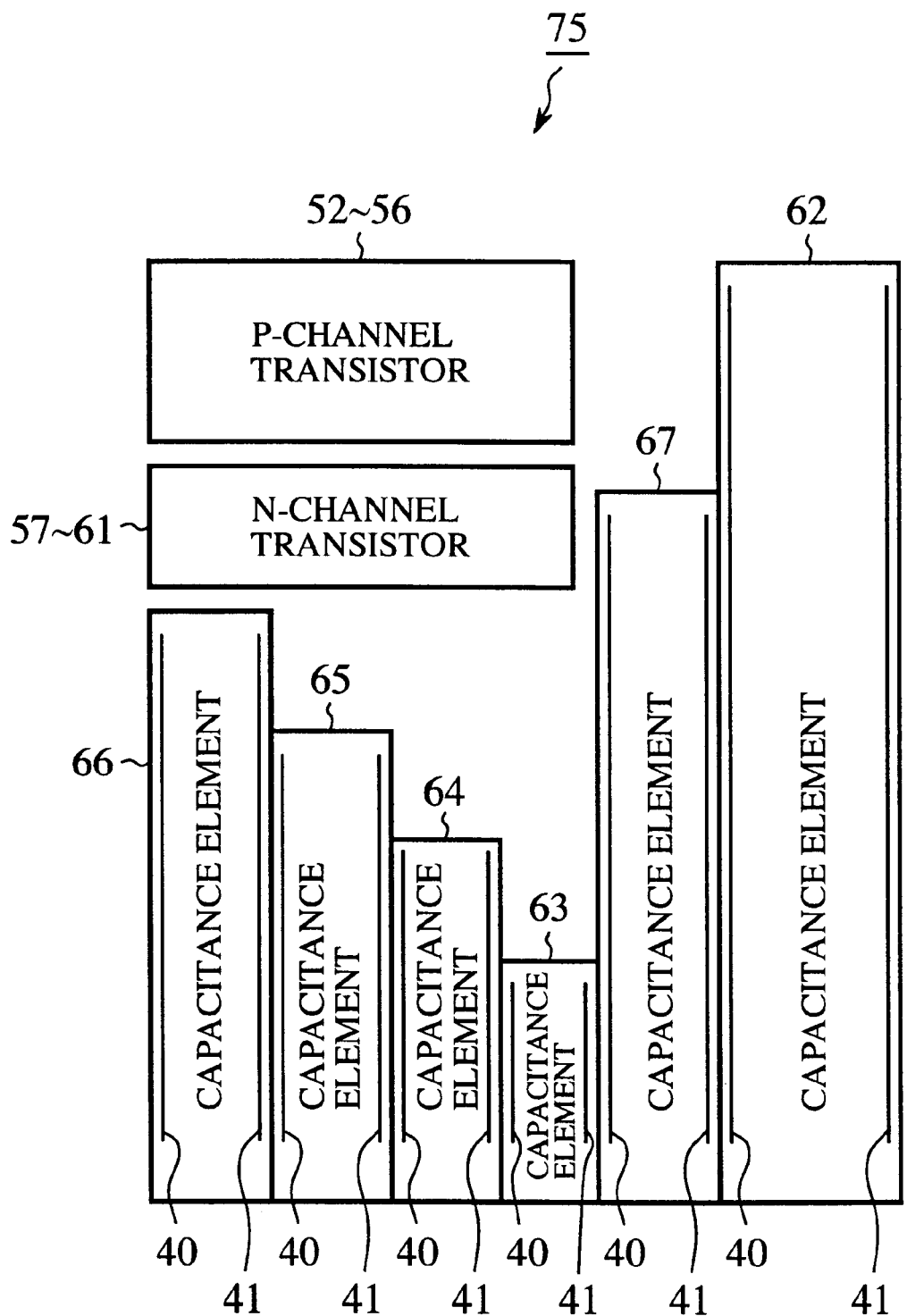
FIG. 3 is a diagram showing a layout of a capacitance-value switching circuit of an embodiment 2 in accordance with the present invention.

FIG. 3 is a diagram showing a layout of the capacitance-value switching circuit 75 (FIG. 2) of an embodiment 2 in accordance with the present invention. In FIG. 3, reference numerals 52–56 designate the P-channel transistors, and 57–61 designate the N-channel transistors. Reference numerals 62–67 designate the capacitance elements with the capacitance value switching function. The reference numeral 40 designates the input terminal, and 41 designates the output terminal. The switches for the capacitance value switching are composed of the P-channel transistors 52–56 and N-channel transistors 57–61.

Next, the geometry of the capacitance elements 62–67 will be described.

In FIG. 3, the input side of the capacitance elements 62–67 is connected to the input terminal 40 (IN) and the output side thereof is connected to the output terminal 41 (OUT) (see, FIG. 2). In this case, the input-output resistance of each of the capacitance elements 62–67 causes the deviation of desired filter characteristics. Accordingly, to reduce the input-output resistance of each of the capacitance elements 62–67, the geometry of the capacitance elements 62–67 is made rectangular. For example, when a MOS capacitance is applied to the capacitance elements 62–67, the sheet resistance value is about a few hundred ohms. Incidentally, the rectangular capacitance elements 62–67 of FIG. 3 have a thickness in the direction normal to the sheet of FIG. 3.

Although the present embodiment 2 is described as the layout of the capacitance-value switching circuit 75 of the embodiment 1 as shown in FIG. 2, the present embodiment 2 is also applicable to the layout of the capacitance-value switching circuit of the following embodiments 3–10.

As described above, the filter-equipped semiconductor integrated circuit in accordance with the present embodiment 2 is configured such that the capacitance elements 62–67 have a rectangular geometry.

As described above, according to the present embodiment 2, the geometry of the capacitance elements constituting the filter are made rectangular. Accordingly, the input-output resistance of each capacitance element can be reduced, which offers an advantage of being able to prevent the deviation of the filter characteristics.

Embodiment 3

Figure 4:
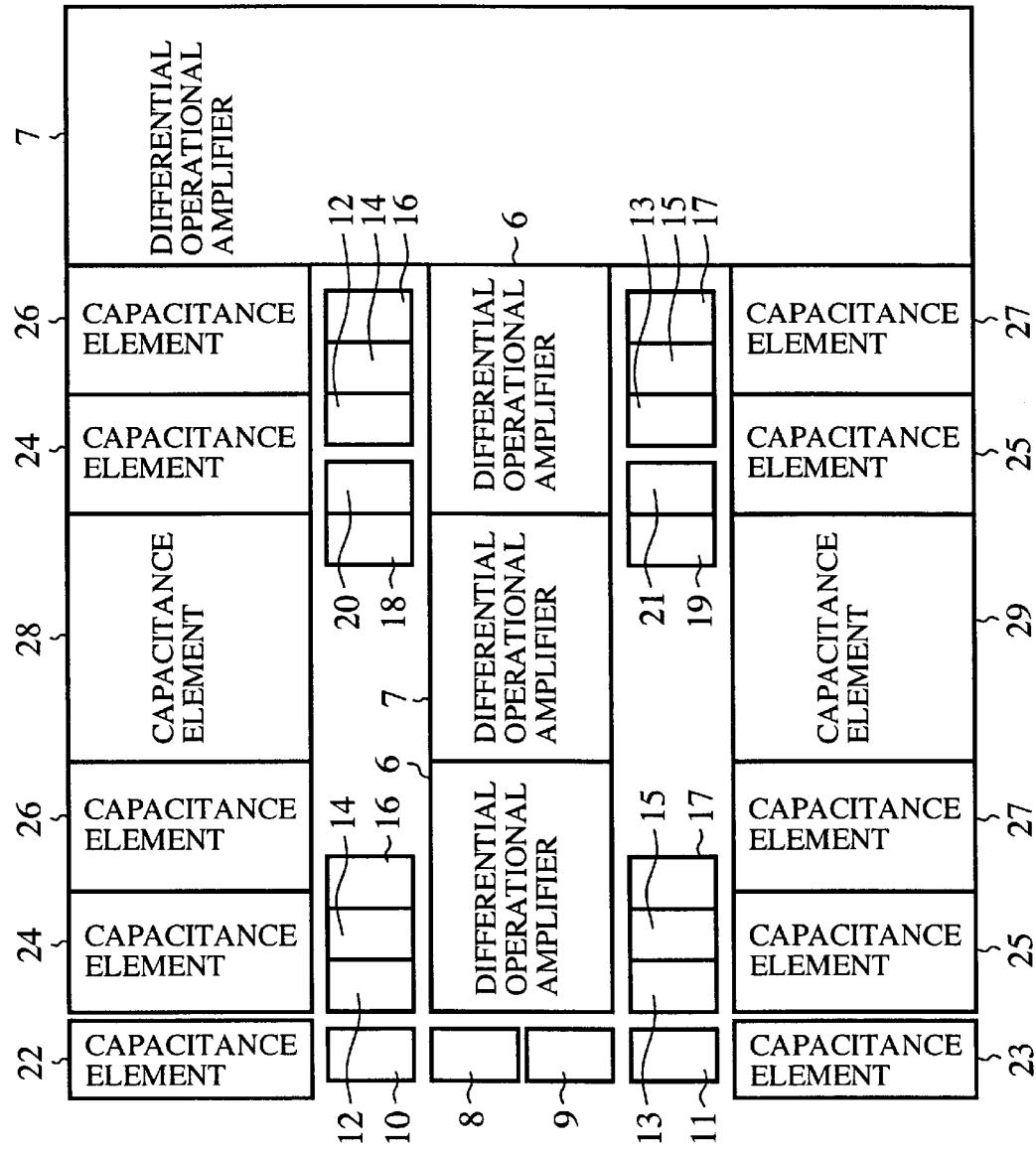
FIG. 4 is a diagram showing a layout of a filter circuit of an embodiment 3 in accordance with the present invention.

FIG. 4 is a diagram showing a layout of a filter circuit of an embodiment 3 in accordance with the present invention. In FIG. 4, reference numerals 6 and 7 designate the differential operational amplifiers, 8–21 designate the resistance elements and 22–29 designate the capacitance elements. The differential operational amplifiers 6 and 7 are disposed near the center, the resistance elements 8–21 are disposed adjacent to the differential operational amplifiers 6 and 7, and the capacitance elements 22–29 are disposed adjacent to the resistance elements 8–21, thereby constituting the filter circuit.

Next, the placement of the resistance elements 8–21 will be described.

The filter circuit of FIG. 1 comprises the second-order filters 30 and 31, and the first-order filter composed of the resistance elements 18–21 and capacitance elements 28 and 29. In FIG. 4, the resistance elements 10,12,14 and 16 constituting the second-order filter 30 are disposed close to each other, and the resistance elements 11, 13, 15 and 17 constituting the second-order filter 30 are also disposed close to each other. In addition, the resistance elements 18 and 20 constituting the first-order filter are disposed close to each other, and the resistance elements 19 and 21 constituting the first-order filter are also disposed close to each other. Thus, desired filtering characteristics are achieved.

In the filter circuit of FIG. 1, the Q-factor of the filter circuit is determined by ratios between the resistance values of the resistance elements and the capacitance values of the capacitance elements. Accordingly, the Q-factor of a desired value can be achieved by disposing the resistance elements constituting the filter close to other elements to shorten wiring elements interconnecting the differential operational amplifiers, resistance elements and capacitance elements to minimize the resistance values and capacitance values arising from the wiring elements. For example, the Q-factor of the second-order filter 30 of the filter circuit of FIG. 1 is given by the following expression.

$$Q = (C2/C1)^{0.5} \times R2/(R1 \times R4)^{0.5} \tag{3}$$

Although the present embodiment 3 assumes the filter circuit of the embodiment 1, the layout of the present embodiment 3 is also applicable to the layout of the embodiment 2 and the layouts of the following embodiments 4–10.

As described above, the filter-equipped semiconductor integrated circuit of the present embodiment 3 disposes the resistance elements 10–21 considering the characteristics of the filter.

As described above, the present embodiment 3 is configured such that the resistance elements constituting the filter are, disposed close to other elements to minimize the resistance values and capacitance values caused by the wiring elements interconnecting the differential operational amplifiers, resistance element and capacitance element. Thus, the present embodiment 3 offers an advantage of being able to achieve the desired Q-factor, which is determined by the ratios between the resistance values of the resistance elements and the capacitance values of the capacitance elements.

Embodiment 4

Figure 5:
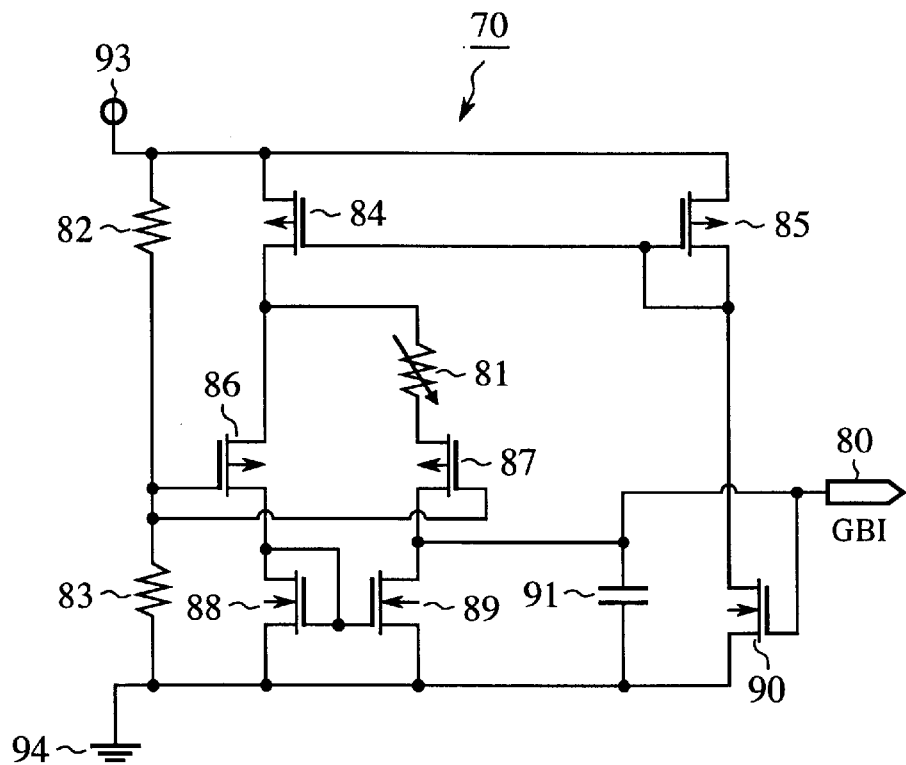
FIG. 5 is a circuit diagram showing a configuration of an operational-amplifier bias circuit of an embodiment 4 in accordance with the present invention.
Figure 7:
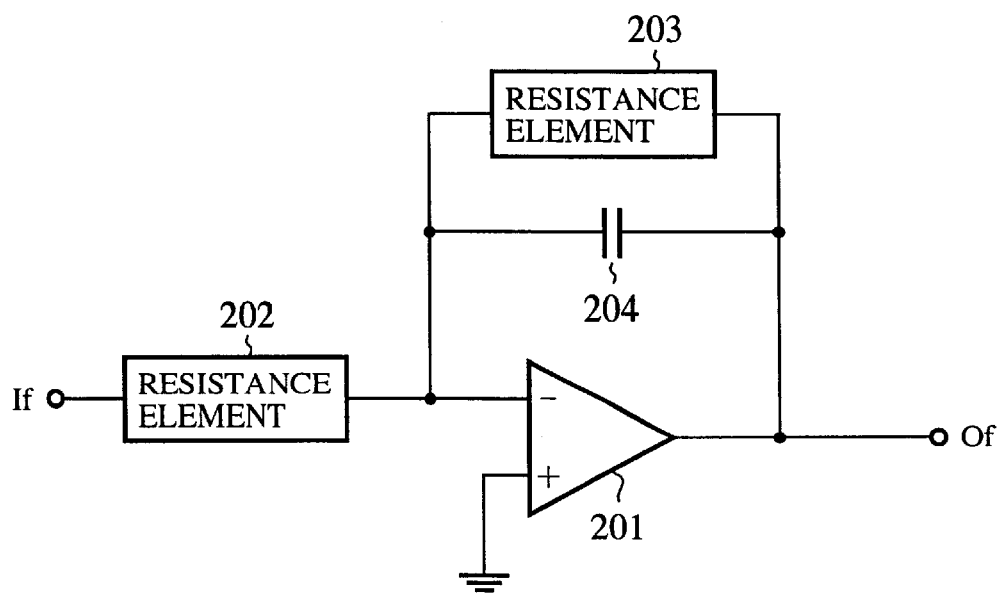
FIG. 7 is a circuit diagram showing a configuration of a conventional filter-equipped semiconductor integrated circuit.

FIG. 5 is a circuit diagram showing a configuration of the operational-amplifier bias circuit 70 of an embodiment 4 in accordance with the present invention. In FIG. 5, the reference numeral 80 designates an output terminal, 81 designates a resistance element, reference numerals 82 and 83 each designate a resistance element, 84–87 each designate a P-channel transistor, 88–90 each designate an N-channel transistor, the reference numeral 91 designates a capacitance element, 93 designates a power supply terminal, and 94 designates a GND terminal.

Switching the resistance value of the resistance element 81 makes it possible to adjust the bias voltage that is output from the output terminal 80 (GBI) to be used by the differential operational amplifiers 6 and 7. The operational-amplifier bias circuit 70 as shown in FIG. 5 is a circuit for adjusting the GB (gain bandwidth) product of the differential operational amplifiers 6 and 7 constituting the filter circuit of FIG. 1.

Next, the connection within the operational-amplifier bias circuit 70 will be described.

A first terminal of the resistance element 82 is connected to the power supply terminal 93, and its second terminal is connected to a first terminal of the resistance element 83. A second terminal of the resistance element 83 is connected to the GND terminal 94. The P-channel transistor 84 has its drain connected to the power supply terminal 93, its source connected to the drain of the P-channel transistor 86 and to a first terminal of the resistance element 81, and its gate connected to the gate and source of the P-channel transistor 85.

The P-channel transistor 86 has its source connected to the source and gate of the N-channel transistor 88, and its gate connected to the first terminal of the resistance element 83. The N-channel transistor 88 has its drain connected to the GND terminal 94, and its gate connected to the gate of the N-channel transistor 89.

The P-channel transistor 87 has its drain connected to the second terminal of the resistance element 81, its source connected to the source of the N-channel transistor 89 and to the output terminal 80 (GBI), and its gate connected to the first terminal of the resistance element 83. The N-channel transistor 89 has its drain connected to the GND terminal 94.

The P-channel transistor 85 has its drain connected to the power supply terminal 93, and its source connected to the source of the N-channel transistor 90. The P-channel transistor 90 has its drain connected to the GND terminal 94, and its gate connected to the output terminal 80 (GBI). The capacitance element 91 has its first terminal connected to the output terminal 80 (GBI), and its second terminal connected to the GND terminal 94.

Next, the operation of the present embodiment 4 will be described.

The operational-amplifier bias circuit 70 of FIG. 5 is used to adjust the cut-off frequency $f_c$ by varying the capacitance values of the capacitance elements in the case where the manufacturing variations in the resistance elements and, capacitance elements of the filter circuit as shown in FIG. 1 are present in the foregoing embodiment 1.

In FIGS. 1 and 5, to adjust the cut-off frequency $f_c$, the GB products of the differential operational amplifiers 6 and 7 are adjusted to optimum values by switching the resistance value of the resistance element 81 of FIG. 5 as well as by varying the capacitance values of the capacitance elements.

More specifically, the operational-amplifier bias circuit of FIG. 5 is configured such that the GB products of the differential operational amplifiers 6 and 7 of FIG. 1 are proportional to $1/(R \times C_c)$, where R is the resistance value of the resistance element 81, and $C_c$ is a phase compensation capacitance (with a fixed capacitance value) included in the differential operational amplifiers 6 and 7.

As described above, the filter-equipped semiconductor integrated circuit of the present embodiment 4 further comprises the operational-amplifier bias circuit 70 as shown in FIG. 5 for varying the GB product of the operational amplifier.

As described above, by controlling the GB products of the differential operational amplifiers to the optimum values using the operational-amplifier bias circuit, the present embodiment 4 offers an advantage of being able to adjust the cut-off frequency by varying the capacitance values of the capacitance elements in spite of the manufacturing variations in the resistance elements and capacitance elements constituting the filter.

Embodiment 5

Figure 6:
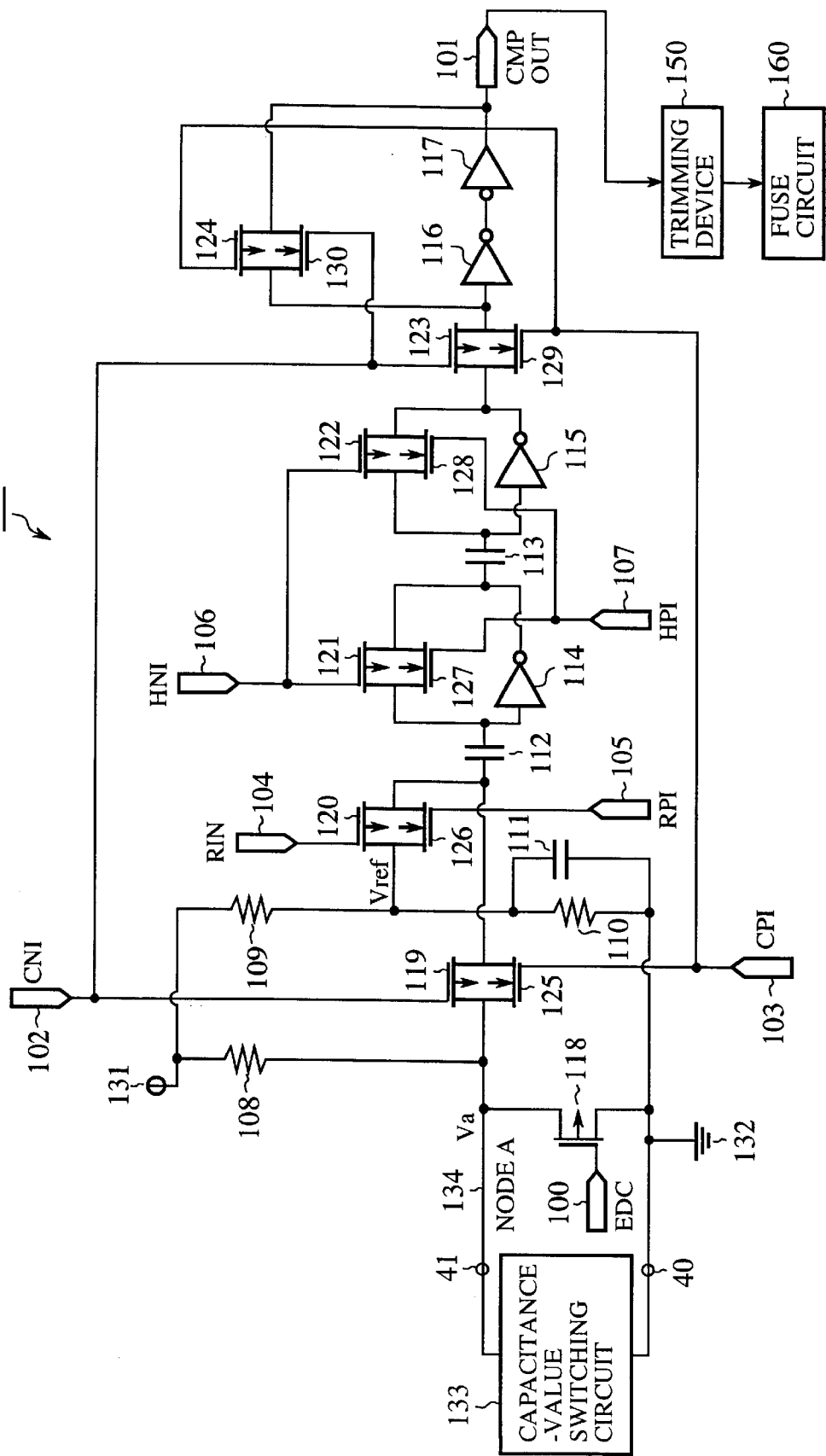
FIG. 6 is a circuit diagram showing a configuration of a time-constant detecting circuit of an embodiment 5 in accordance with the present invention.

FIG. 6 is a circuit diagram showing a configuration of the time-constant detecting circuit 180 of an embodiment 5 in accordance with the present invention. In FIG. 6, the reference numeral 100 designates an input terminal, and 101 designates an output terminal. Reference numerals 102–107 each designate an input terminal, 108–110 each designate a resistance element, 111–113 each designate a capacitance element, 114–117 each designate an inverter, 118–124 each designate a P-channel transistor, and 125–130 each designate an N-channel transistor. The reference numeral 131 designates a power supply terminal, 132 designates a GND (ground) terminal, 133 designates the capacitance-value switching circuit as shown in FIG. 2, and 134 designates a node A. The time-constant detecting circuit 180 decides the time constant of the capacitance-value switching circuit 133 and resistance element 108 by sequentially switching the capacitance value of the capacitance-value switching circuit 133, and outputs the time constant information from the output terminal 101 (CMPOUT) as the output signal. The output signal is supplied to a trimming device 150. The trimming device 150 blows a fuse of a fuse circuit 160 or maintains the connection in response to the output signal. The capacitance-value switching circuit 133 used in FIG. 6 has the same geography and configuration as the capacitance elements constituting the filter circuit of FIG. 1, and is formed separately from them.

Next, the connection within the time-constant detecting circuit 180 will be described.

A first terminal of the resistance element 108 is connected to the power supply terminal 131, and its second terminal is connected to the node A 134. The node A 134 is connected to a first terminal of the capacitance-value switching circuit 133 (output terminal 41 (OUT) of FIG. 2), and to the drain of the P-channel transistor 118. A second terminal of the capacitance-value switching circuit 133 (input terminal 40 (IN) of FIG. 2) is connected to the GND terminal 132.

The P-channel transistor 118 has its source connected to the GND terminal 132, and its gate connected to the input terminal 100 (EDC). The resistance element 109 has its first terminal connected to the power supply terminal 131 and its second terminal connected to first terminals of the resistance element 110 and capacitance element 111. The second terminal of the resistance element 110 and that of the capacitance element 111 are connected to the GND terminal 132.

The P-channel transistor 119 and N-channel transistor 125 have their sources connected to the node A 134, and their drains connected to a first terminal of the capacitance element 112. The P-channel transistor 119 has its gate connected to the input terminal 102 (CNI), and the N-channel transistor 125 has its gate connected to the input terminal 103 (CPI).

The P-channel transistor 120 and N-channel transistor 126 have their sources connected to the second-terminal of the resistance element 109, and their drains connected to the first, terminal of the capacitance element 112. The P-channel, transistor 120 has its gate connected to the input terminal 104 (RNI), and the N-channel transistor 126 has its gate connected to the input terminal 105 (RPI).

The P-channel transistor 121 and N-channel transistor 127 have their sources connected to,a second terminal of the capacitance element 112, and their drains connected to a first terminal-of the capacitance element,113. The P-channel transistor 121 has its gate connected to the input terminal 106 (HNI), and the N-channel transistor 127 has its gate connected to the input terminal 107 (HPI). The inverter 114 has its input terminal connected to the second terminal of the capacitance element 112, and its output terminal connected to the first terminal of the capacitance element 113.

The P-channel transistor 122 and N-channel transistor 128 have their sources connected to a second terminal of the capacitance element 113, and their drains connected to the output terminal of the inverter 115. The P-channel transistor 122 has its gate connected to the input terminal 106 (HNI), and the N-channel transistor 128 has its gate connected to the input terminal 107 (HPI). The inverter 115 has its input terminal connected to the second terminal of the capacitance element 113.

The P-channel transistor 123 and N-channel transistor 129 have their sources connected to the output terminal of the inverter 115, and their drains connected to the input terminal of the inverter 116. The P-channel transistor 122 has its gate connected to the input terminal 102 (CNI), and the N-channel transistor 129 has its gate connected to the input terminal 103 (CPI).

The P-channel transistor 124 and N-channel transistor 130 have their sources connected to the input terminal of the inverter 116, and their drains connected to the output terminal 110 (CMPOUT). The P-channel transistor 124 has its gate connected to the input terminal 103 (CPI), and the N-channel transistor 130 has its gate connected to the input terminal 102 (CNI). The inverter 117 has its input terminal connected to the output terminal of the inverter 116, and its output terminal connected to the output terminal 101 (CMPOUT).

Next, the operation of the present embodiment 5 will be described.

In FIG. 6, the capacitance-value switching circuit 133 carries out the switching of the capacitance value in sequence as follows. In this case, according to its five capacitance value switching terminals as shown in FIG. 2, the capacitance-value switching circuit 133 makes a decision as to the time constant five times. When the switching range of the capacitance value of the capacitance-value switching circuit 133 is from $C_{max}$ to $C_{min}$, the first decision is made by setting the capacitance value of the capacitance-value switching circuit 133 at $(C_{max}-C_{min})/2$, the central value of the capacitance switching range, and by comparing the time constant of the capacitance-value switching circuit 133 and the resistance element 108 with a reference time constant, thereby deciding which is greater. The second decision of the time constant is made by setting the capacitance value at an intermediate value between the value $(C_{max}-C_{min})/2$ and $C_{max}$ or $C_{min}$, and by comparing the time constant with the reference time constant. In this way, the decision of the time constant is made five times. It is not essential to set the initial capacitance value at $(C_{max}-C_{min})/2$, but allowable to set it at an appropriate value between the value $C_{max}$ and $C_{min}$.

Assume that the capacitance values of the capacitance elements 62–67 of FIG. 2 are 5.5 pF, 0.25 pF, 0.5 pF, 1.0 pF, 2.0 pF and 3.0 pF, respectively. In this case, the switching range $C_{max}-C_{min}$ of the capacitance value of the capacitance-value switching circuit 133 is 12.25 pF–0.25 pF, and the central value $(C_{max}-C_{min})/2$ of the capacitance switching range is 6.0 pF.

The time-constant detecting circuit 180 as shown in FIG. 6 starts its comparing operation as follows. First, a high-level signal is supplied to the input terminal 106 and a low-level signal is supplied to the input terminal 107 to cancel out the offset. Second, the high-level signal is supplied to the input terminal 104 and the low-level signal is supplied to the input terminal 105 to charge the capacitance element 112 to a compared voltage (reference voltage) Vref through the resistance element 109. Then, the high-level signal is supplied to the input terminal 102 and the low-level signal is supplied to the input terminal 103 to start the comparison. The signal produced from the output terminal 101 becomes high when the voltage Va at the node A 134 is higher than the reference voltage Vref, and becomes low when the voltage Va is lower than the reference voltage Vref. During the capacitance switching, the input terminals 102, 104 and 106 are supplied with the low-level signal, and the input terminals 103, 105 and 107 are supplied with the high-level signal.

Assume that the capacitance elements 62 and 67 are selected at the first decision. In this case, the capacitance value of the capacitance-value switching circuit 133 becomes 5.5 pF+3.0 pF=8.5 pF. If the compared result of the voltage Va at the node A 134 with the reference voltage Vref is Va<Vref, the output terminal 101 outputs a low-level signal.

Since the output terminal 101 produces the low-level signal as the result of the first decision, the capacitance elements 62 and 65 are selected at the second decision, placing the capacitance value of the capacitance-value switching circuit 133 at 5.5 pF+1.0 pF=6.5 pF. If the compared result of the voltage Va at the node A 134 with the reference voltage Vref is Va>Vref, the output terminal 101 outputs a high-level signal.

Since the output terminal 101 produces the high-level signal as the result of the second decision, the capacitance elements 62 and 66 are selected at the third decision, placing the capacitance value of the capacitance-value switching circuit 133 at 5.5 pF+2.0 pF=7.5 pF. If the compared result of the voltage Va at the node A 134 with the reference voltage Vref is Va<Vref, the output terminal 101 outputs a low-level signal.

Since the output terminal 101 produces the low-level signal as the result of the third decision, the capacitance elements 62, 64 and 65 are selected at the fourth decision, placing the capacitance value of the capacitance-value switching circuit 133 at 5.5 pF+0.5 pF+1.0 pF=7.0 pF. If the compared result of the voltage Va at the node A 134 with the reference-voltage Vref is Va>Vref, the output terminal 101 outputs a high-level signal.

Since the output terminal 101 produces the high-level signal as the result of the fourth decision, the capacitance elements 62, 63, 64 and 65 are selected at the fifth decision, placing the capacitance value of the capacitance-value switching circuit 133 at 5.5 pF+0.5 pF+1.0 pF+0.25 pF=7.25 pF.

The first to fifth decisions are made according to the time constant of the capacitance elements, which are selected in the capacitance-value switching circuit 133 as shown in FIG. 2, and the resistance element 108 shown in FIG. 6. Thus, the capacitance value determined as the sum of the capacitance elements selected in the capacitance-value switching circuit 133 as shown in FIG. 6 varies as described above, resulting in the final value of 7.25 pF. As a result, the deviation of the resistance value of −10% is compensated by increasing the capacitance value by 10%.

The output of the output terminal 101 (CMPOUT) produced as a result of the five decisions (large or small decision results) is supplied to the trimming device 150, so that the results of the five decisions are stored in the fuse circuit 160. The recorded code is used as the capacitance value switching code of the capacitance elements of the filter circuit of FIG. 1. This makes it possible to adjust the cut-off frequency $f_c$ of the filter circuit.

As described above, the filter-equipped semiconductor integrated circuit of the present embodiment 5 comprises the filter 30 including the resistance elements 12–17, the capacitance elements 24–27, each of which consists of the capacitance-value switching circuit 75 (FIG. 2) for changing the capacitance value of the capacitance element, and the operational amplifiers 6 and 7; and the time-constant detecting circuit 180 (FIG. 6) for detecting the time constant of the capacitance element 133 and resistance element 108, which are formed independently of and have the same geography and configuration as the capacitance elements 24–27 and the resistance elements 12–17. It changes the capacitance values of the capacitance elements of the filter 30 in accordance with the time constant detected.

As described above, since the present embodiment 5 detects the time constant using the time-constant detecting, circuit, it offers an advantage of being able to detect the deviation of the cut-off frequency with ease.

Embodiment 6

The cut-off frequency $f_c$ and the GB product of the differential operational amplifiers can be adjusted to optimum values by using the time constant information, which is detected by the time-constant detecting circuit 180 of FIG. 6, as the switching code of the capacitance values of the capacitance elements of the filter circuit of FIG. 1, and as the switching code of the resistance value of the resistance element 81 of the operational-amplifier bias circuit of FIG. 5.

As described above, the filter-equipped semiconductor integrated circuit of the present embodiment 6 comprises the operational-amplifier bias circuit 70 as shown in FIG. 5 for controlling the GB product of the operational amplifiers, thereby making it possible to vary the GB product according to the time constant detected.

As described above, the present embodiment 6 is configured such that the time-constant detecting circuit 180 detects the time constant. Thus, it can easily detect the deviation of the cut-off frequency, offering an advantage of being able to control the GB product of the differential operational amplifier in accordance with the time constant.

Embodiment 7

When the embodiment 5 detects the time constant using the time-constant detecting circuit 180 of FIG. 6, the parasitic capacitance at the node A can cause the detection error of the time constant. To minimize the parasitic capacitance, the wiring between the capacitance element consisting of the capacitance-value switching circuit 133, P-channel transistors 118 and 119, N-channel transistor 125 and resistance element 108 of the capacitance-value switching circuit 133 are made short and thin. In addition, the L size (gate length) of the P-channel transistors 118 and 119 and N-channel transistor 125 is made thin to reduce the parasitic capacitance. Thus, the time-constant detecting circuit 180 with a small error is achieved.

Although the present embodiment 7 is applied to the time-constant detecting circuit of the embodiment 5 in the foregoing description, it is also applicable to the time-constant detecting circuit of the embodiment 9 which will be described later.

As described above, the filter-equipped semiconductor integrated circuit of the present embodiment 7 is configured in such a manner that the parasitic capacitance of the time-constant detecting circuit is reduced. More specifically, the wiring between the capacitance elements 111–113, resistance elements 108–110 and transistors 118–130 of the time-constant detecting circuit is carried out, and the sizes of the transistors are determined, in such a fashion that the parasitic capacitance is reduced.

As described above, the present embodiment 7 is configured such that the wiring between the capacitance elements, transistors and resistance elements are made short and thin, and the L size of the transistors are made thin to reduce the parasitic capacitance. As a result, the present embodiment 7 offers an advantage of being able to implement the time-constant detecting circuit with a small error.

Embodiment 8

When the embodiment 6 detects the time constant using the time-constant detecting circuit 180 of FIG. 6, the parasitic capacitance at the node A can cause the detection error of the time constant. To minimize the parasitic capacitance, the wiring between the capacitance element consisting of the capacitance-value switching circuit 133, P-channel transistors 118 and 119, N-channel transistor 125 and resistance element 108 of the capacitance-value switching circuit 133 are made short and thin. In addition, the L size of the P-channel transistors 118 and 119 and N-channel transistor 125 are made thin to reduce the parasitic capacitance. Thus, the time-constant detecting circuit with a small error is achieved.

Although the present embodiment 8 is applied to the time-constant detecting circuit of the embodiment 6 in the foregoing description, it is also applicable to the time-constant detecting circuit of the embodiment 10 which will be described later.

As described above, the filter-equipped semiconductor integrated circuit of the present embodiment 8 is configured in such a manner that the parasitic capacitance of the time-constant detecting circuit is reduced. More specifically, the wiring between the capacitance elements 111–113, resistance elements 108–110 and transistors 118–130 of the time-constant detecting circuit is carried out, and the sizes of the transistors are determined, in such a fashion that the parasitic capacitance is reduced.

As described above, the present embodiment 8 is configured such that the wiring between the capacitance elements, transistors and resistance elements are made thin and short, and the L size of the transistors are made thin to reduce the parasitic capacitance. As a result, the present embodiment 8 offers an advantage of being able to implement the time-constant detecting circuit with a small error.

Embodiment 9

The time constant detection information detected by the time-constant detecting circuit 180 of FIG. 6 in the foregoing embodiment 5 is recorded using the fuse circuit 160. The time constant detection is carried out in a test prior to shipment, and the fuse circuit 160 stores the detection results. Thus, it becomes unnecessary in an actual operation to detect the time constant, and to adjust the cut-off frequency $f_c$ and the GB product of the differential operational amplifiers constituting the filter circuit. As a result, it can eliminate the time required for detecting the time constant.

As described above, the filter-equipped semiconductor integrated circuit of the present embodiment 9 records the time constant in the fuse circuit.

As described above, the present embodiment 9 is configured such that the time constant detection information is recorded using the fuse circuit 160. As a result, it is unnecessary for the actual operation to carry out the time constant detection, and to adjust the cut-off frequency and the GB product of the differential operational amplifiers constituting the filter circuit. Thus, the present embodiment 9 offers an advantage of being able to eliminate the time required for detecting the time constant at the actual operation.

Embodiment 10

The time constant detection information detected by the time-constant detecting circuit 180 of FIG. 6 in the foregoing embodiment 6 is recorded using the fuse circuit 160. The time constant detection is carried out in a test prior to shipment, and the fuse circuit 160 stores the detection result. Thus, it becomes unnecessary for an actual operation to detect the time constant, and to adjust the cut-off frequency $f_c$ and the GB product of the differential operational amplifiers constituting the filter circuit. As a result, it can eliminate the time required for detecting the time constant.

As described above, the filter-equipped semiconductor integrated circuit of the present embodiment 10 records the time constant in the fuse circuit.

As described above, the present embodiment 10 is configured such that the fuse circuit stores the time constant detection information. As a result, it is unnecessary for the actual operation to carry out the time constant detection, and to adjust the cut-off frequency and the GB product of the differential operational amplifiers constituting the filter circuit. Thus, the present embodiment 10 offers an advantage of being able to eliminate the time required for detecting the time constant at the actual operation.

What is claimed is:

1. A semiconductor integrated circuit comprising:
    a filter including resistance elements, capacitance elements, and operational amplifiers, each of the capacitance elements including a capacitance-value switching circuit for changing capacitance of the capacitance element;
    a time-constant detecting circuit for detecting a time constant of a capacitance element and a resistance element, which correspond to the capacitance elements and resistance elements of the filter, the capacitances of the capacitance elements of the filter being adjusted in response to the time constant detected by said time-constant detecting circuit; and
    an operational-amplifier bias circuit for varying a gain-bandwidth (GB) product of the operational amplifiers, wherein said operational-amplifier bias circuit varies the GB product in response to the time constant detected by the time-constant detecting circuit.

2. A semiconductor integrated circuit comprising:
    a filter including resistance elements, capacitance elements, and operational amplifiers, each of the capacitance elements including a capacitance-value switching circuit for changing capacitance of the capacitance element;
    a time-constant detecting circuit for detecting a time constant of a capacitance element and a resistance element, which correspond to the capacitance elements and resistance elements of the filter, the capacitances of the capacitance elements of the filter being adjusted in response to the time constant detected by said time-constant detecting circuit; and
    a fuse circuit for recording the time constant detected by the time-constant detecting circuit.

3. The semiconductor integrated circuit according to claim 1, further comprising a fuse circuit for recording the time constant detected by the time-constant detecting circuit.

4. The semiconductor integrated circuit according to claim 2, wherein the capacitance elements have a rectangular geometry.

5. The semiconductor integrated circuit according to claim 3, wherein the capacitance elements have a rectangular geometry.

6. The semiconductor integrated circuit according to claim 2, wherein the resistance elements are disposed in consideration of characteristics of the filter.

7. The semiconductor integrated circuit according to claim 3, wherein the resistance elements are disposed in consideration of characteristics of the filter.

8. The semiconductor integrated circuit according to claim 2, wherein wiring between the capacitance elements, resistance elements, and transistors of said time-constant detecting circuit are made short, and dimensions of the transistors are made thin to reduce parasitic capacitances to a minimum.

9. The semiconductor integrated circuit according to claim 3, wherein wiring between the capacitance elements, resistance elements, and transistors of said time-constant detecting circuit are made short, and dimensions of the transistors are made thin to reduce parasitic capacitances to a minimum.

* * * * *